Figure 3:
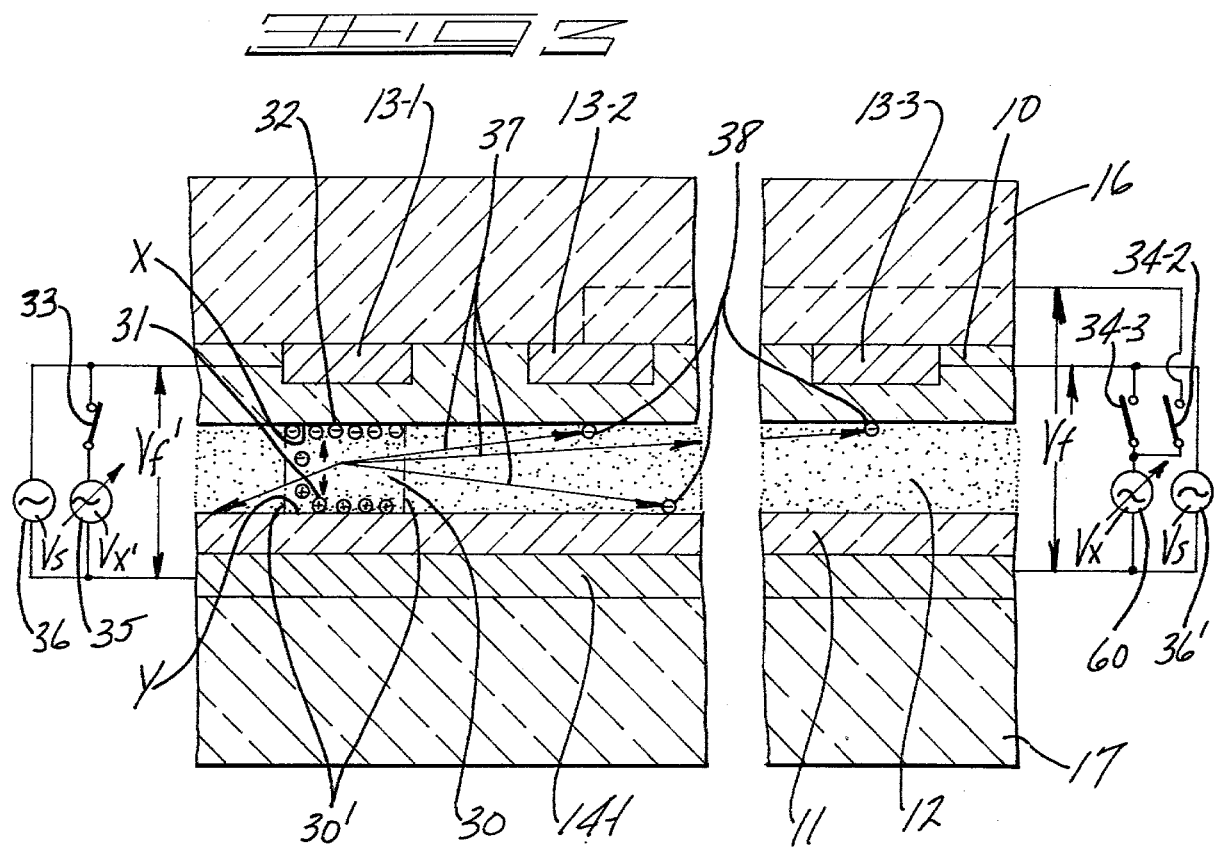

United States Patent [19]

Byrum, Jr. et al.

[11] 4,205,392
[45] May 27, 1980

[54] GAS DISCHARGE DISPLAY DEVICE

[75] Inventors: Bernard W. Byrum, Jr., Toledo; Roger E. Ernsthausen, Luckey; Michael E. Fein, Toledo, all of Ohio

[73] Assignee: Owens-Illinois, Inc., Toledo, Ohio

[21] Appl. No.: 630,587

[22] Filed: Nov. 10, 1975

Related U.S. Application Data

[60] Continuation-in-part of Ser. No. 293,555, Sep. 29, 1972, abandoned, which is a division of Ser. No. 210,093, Dec. 20, 1971, abandoned.

[51] Int. Cl.² ............................................. G11C 11/28
[52] U.S. Cl. .................................. 365/116; 315/169.4
[58] Field of Search ..................... 340/173 R, 173 PL; 315/169 R

[56] References Cited

U.S. PATENT DOCUMENTS

| | | | |
|---|---|---|---|
| 3,454,408 | 7/1969 | Busdiecker | 106/47 |
| 3,863,089 | 1/1975 | Ernsthausen | 313/188 |
| 3,942,161 | 3/1976 | Byrum et al. | 340/173 PL |

*Primary Examiner*—Terrell W. Fears
*Attorney, Agent, or Firm*—Donald K. Wedding; Myron E. Click; David H. Wilson

[57] ABSTRACT

There is disclosed a gas discharge device containing at least two electrodes, at least one of the electrodes being insulated from the gas by a dielectric member. There is particularly disclosed a multiple gaseous discharge display/memory panel having an electrical memory and capable of producing a visual display, the panel being characterized by an ionizable gaseous medium in a gas chamber formed by a pair of opposed dielectric material charge storage members, each of which is respectively backed by an array of electrodes, the electrodes behind each dielectric material member being oriented with respect to the electrodes behind the opposing dielectric material member so as to define a plurality of discrete discharge units.

At least one dielectric insulating member contains a predetermined beneficial amount of a source of at least one transition element selected from V, Nb, Ta, Cr, Mo, W, Mn, Tc, Re, Fe, Ru, Os, Co, Rh, Ir, Pd, and Pt.

The selected element or elements may be utilized in any suitable form, such as a compound, mineral, and/or elements. Likewise, such may be incorporated into the dielectric by any suitable means, including being applied as a layer within the dielectric or on the surface thereof.

29 Claims, 5 Drawing Figures

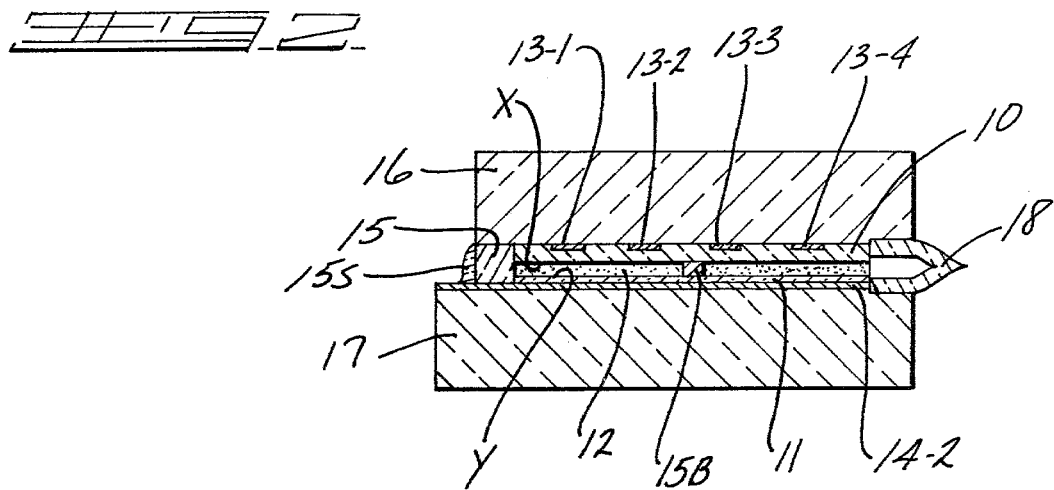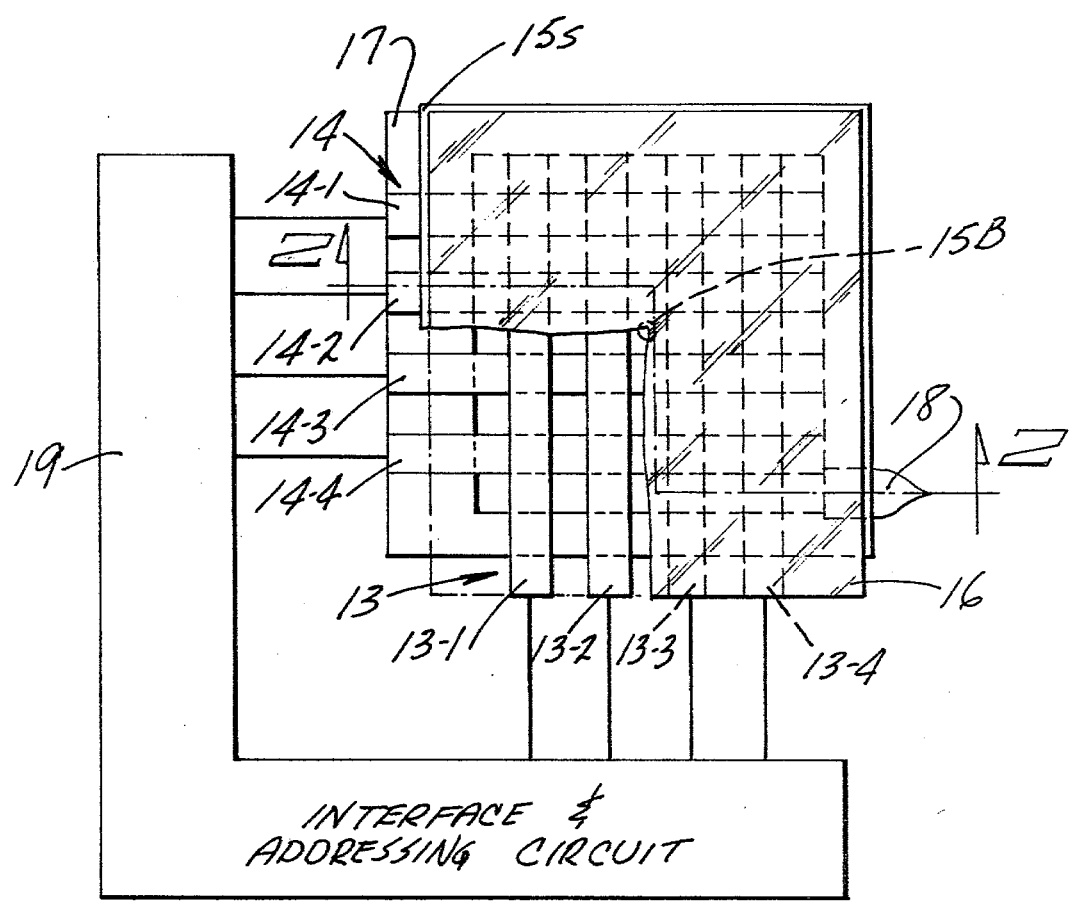

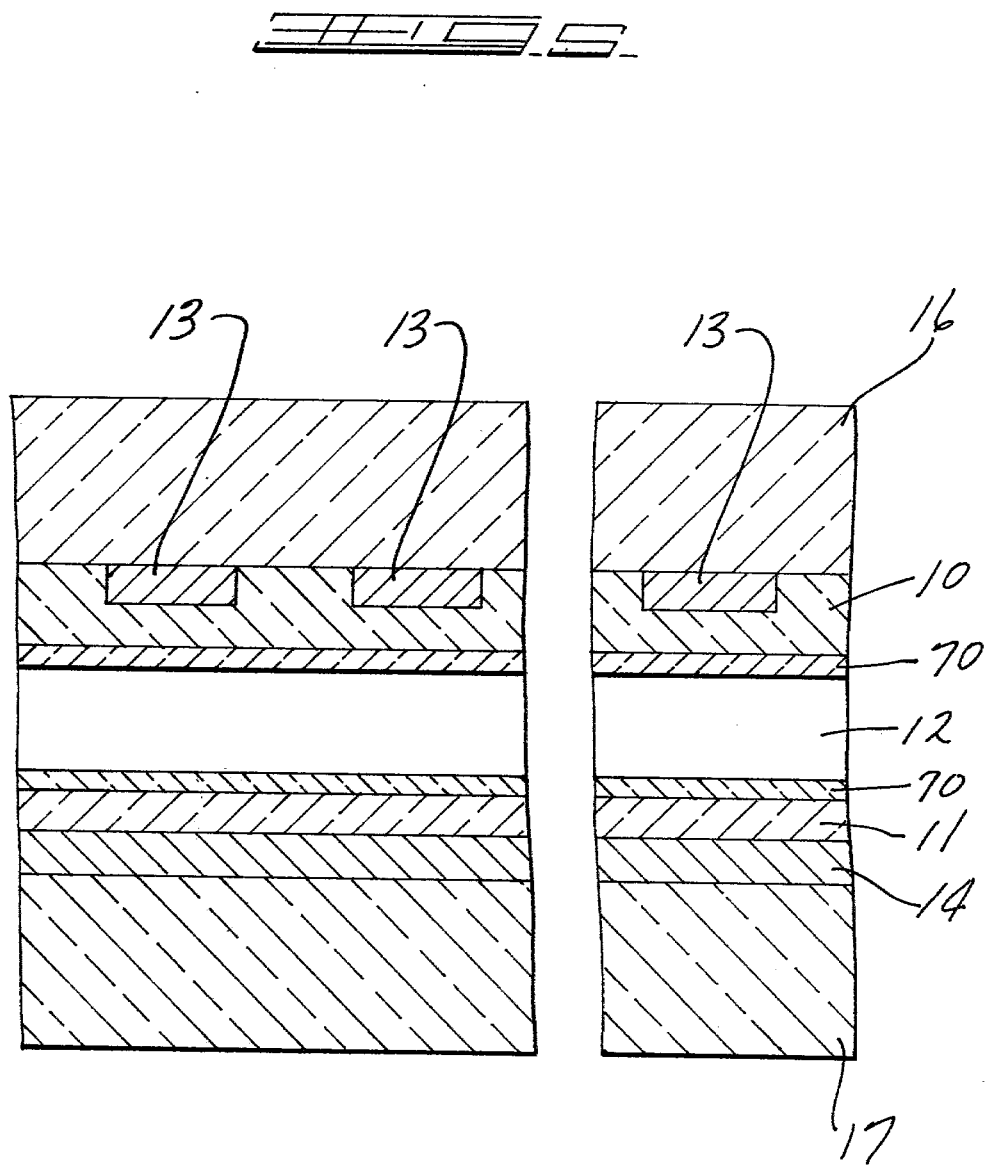

GAS DISCHARGE DISPLAY DEVICE

This is a continuation-in-part of copending U.S. patent application Ser. No. 293,555, now abandoned filed Sept. 29, 1972, which application is a division of previously copending U.S. patent application Ser. No. 210,093, now abandoned filed Dec. 20, 1971. The benefit of 35 U.S.C. 120 is hereby claimed.

BACKGROUND OF THE INVENTION

This invention relates to novel multiple gas discharge display/memory panels or units which have an electrical memory and which are capable of producing a visual display or representation of data such as numerals, letters, television display, radar displays, binary words, etc.

Multiple gas discharge display and/or memory panels of one particular type with which the present invention is concerned are characterized by an ionizable gaseous medium, usually a mixture of at least two gases at an appropriate gas pressure, in a thin gas chamber or space between a pair of opposed dielectric charge storage members which are backed by conductor (electrode) members, the conductor members backing each dielectric member typically being transversely oriented to define a plurality of discrete gas discharge units or cells.

In some prior art panels the discharge units are additionally defined by surrounding or confining physical structure such as by cells or apertures in perforated glass plates and the like so as to be physically isolated relative to other units. In either case, with or without the confining physical structure, charges (electrons, ions) produced upon ionization of the elemental gas volume of a selected discharge unit, when proper alternating operating potentials are applied to selected conductors thereof, are collected upon the surfaces of the dielectric at specifically defined locations and constitute an electrical field opposing the electrical field which created them so as to terminate the discharge for the remainder of the half cycle and aid in the initiation of a discharge on a succeeding opposite half cycle of applied voltage, such charges as are stored constituting an electrical memory.

Thus, the dielectric layers prevent the passage of substantial conductive current from the conductor members to the gaseous medium and also serve as collecting surfaces for ionized gaseous medium charges (electrons, ions) during the alternate half cycles of the A.C. operating potentials, such charges collecting first on one elemental or discrete dielectric surface area and then on an opposing elemental or discrete dielectric surface area on alternate half cycles to constitute an electrical memory.

An example of a panel structure containing non-physically isolated or open discharge units is disclosed in U.S. Pat. No. 3,499,167 issued to Theodore C. Baker, et al.

An example of a panel containing physically isolated units is disclosed in the article of D. L. Bitzer and H. G. Slottow entitled "The Plasma Display Panel—A Digitally Addressable Display With Inherent Memory", Proceeding of the Fall Joint Computer Conference, IEEE, San Francisco, California, Nov. 1966, pages 541–547. Also reference is made to U.S. Pat. No. 3,559,190.

In the construction of the panel, a continuous volume of ionizable gas is confined between a pair of dielectric surfaces backed by conductor arrays forming matrix elements. The cross conductor arrays may be orthogonally related (but any other configuration of conductor arrays may be used) to define a plurality of opposed pairs of charge storage areas on the surfaces of the dielectric bounding or confining the gas. Thus, for a conductor matrix having H rows and C columns the number of elemental discharge units will be the product $H \times C$ and the number of elemental or discrete areas will be twice the number of such elemental discharge units.

In addition, the panel may comprise a so-called monolithic structure in which the conductor arrays are created on a single substrate and wherein two or more arrays are separated from each other and from the gaseous medium by at least one insulating member. In such a device the gas discharge takes place not between two opposing electrodes, but between two contiguous or adjacent electrodes on the same substrate; the gas being confined between the substrate and an outer retaining wall.

It is also feasible to have a gas discharge device wherein some of the conductive or electrode members are in direct contact with the gaseous medium and the remaining electrode members are appropriately insulated from such gas, i.e., at least one insulated electrode.

In addition to the matrix configuration, the conductor arrays may be shaped otherwise. Accordingly, while the preferred conductor arrangement is of the crossed grid type as discussed herein, it is likewise apparent that where a maximal variety of two dimensional display patterns is not necessary, as where specific standardized visual shapes (e.g., numerals, letters, words, etc.) are to be formed and image resolution is not critical, the conductors may be shaped accordingly, i.e., a segmented display.

The gas is one which produces visible light or invisible radiation which stimulates a phosphor (if visual display is an objective) and a copious supply of charges (ions and electrons) during discharge.

In prior art, a wide variety of gases and gas mixtures have been utilized as the gaseous medium in a gas discharge device. Typical of such gases include CO; $CO_2$; halogens; nitrogen; $NH_3$; oxygen; water vapor; hydrogen; hydrocarbons; $P_2O_5$; boron fluoride; acid fumes; $TiCl_4$; Group VIII gases; air; $H_2O_2$; vapors of sodium, mercury, thallium, cadmium, rubidium, and cesium; carbon disulfide; laughing gas; $H_2S$; deoxygenated air; phosphorus vapors; $C_2H_2$; $CH_4$; naphthalene vapor; anthr cene; freon; ethyl alcohol; methylene bromide; heavy hydrogen; electron attaching gases; sulfur hexafluoride; tritium; radioactive gases; and the rare or inert gases.

In one preferred practice hereof, the gas mixture comprises at least one rare gas, more preferably at least two rare gases, selected from neon, argon, xenon, krypton and radon. Beneficial amounts of mercury and/or helium may also be present.

In an open cell Baker, et al. type panel, the gas pressure and the electric field are sufficient to laterally confine charges generated on discharge within elemental or discrete dielectric areas within the perimeter of such areas, especially in a panel containing non-isolated units.

As described in the Baker, et al. patent, the space between the dielectric surfaces occupied by the gas is such as to permit photons generated on discharge in a selected discrete or elemental volume of gas to pass freely through the gas space and strike surface areas of dielectric remote from the selected discrete volumes, such remote, photon struck dielectric surface areas thereby emitting electrons so as to condition at least one elemental volume other than the elemental volume in which the photons originated.

With respect to the memory function of a given discharge panel, the allowable distance or spacing between the dielectric surfaces depends, inter alia, on the frequency of the alternating current supply, the distance typically being greater for lower frequencies.

While the prior art does disclose gaseous discharge devices having externally positioned electrodes for initiating a gaseous discharge, sometimes called "electrodeless discharge", such prior art devices utilized frequencies and spacings or discharge volumes and operating pressures such that although discharges are initiated in the gaseous medium, such discharges are ineffective or not utilized for charge generation and storage at higher frequencies; although charge storage may be realized at lower frequencies, such charge storage has not been utilized in a display/memory device in the manner of the Bitzer-Slottow or Baker, et al. invention.

The term "memory margin" is defined herein as $$M.M. = \frac{V_f - V_E}{V_f/2}$$

where $V_f$ is the half amplitude of the smallest sustaining voltage signal which results in a discharge every half cycle, but at which the cell is not bi-stable and $V_E$ is the half amplitude of the minimum applied voltage sufficient to sustain discharges once initiated.

It will be understood that basic electrical phenomenon utilized in this invention is the generation of charges (ions and electrons) alternately storable at pairs of opposed or facing discrete points or areas on a pair of dielectric surfaces backed by conductors connected to a source of operating potential. Such stored charges result in an electrical field opposing the field produced by the applied potential that created them and hence operate to terminate ionization in the elemental gas volume between opposed or facing discrete points or areas of dielectric surface. The term "sustain a discharge" means producing a sequence of momentary discharges, one discharge for each half cycle of applied alternating sustaining voltage, once the elemental gas volume has been fired, to maintain alternate storing of charges at pairs of opposed discrete areas on the dielectric surfaces.

In accordance with the practice of this invention, there is incorporated into the dielectric of a gas discharge device a beneficial amount of a source of at least one transition element selected from V, Nb, Ta, Cr, Mo, W, Mn, Tc, Re, Fe, Ru, Os, Co, Rh, Ir, Pd, and Pt.

As used herein, the phrase "incorporated into" is intended to comprise any suitable means whereby a source of the selected element is appropriately combined with the dielectric, such as by intimately adding or mixing the source into the dielectric pre-melt batch or to the melt, by ion exchange; by ion implantation; by diffusion techniques; or by applying one or more layers to the charge storage surface of the dielectric, or to the electrode contact surface of the dielectric, or as an internal layer within the dielectric.

In one particular embodiment hereof, the source of the selected element is applied as one or more layers to the charge-storage surface of the dielectric.

As used herein, the term "layer" is intended to be all inclusive of other similar terms such as film, deposit, coating, finish, spread, covering, etc.

It is contemplated that the element source may be applied as a layer over one or more previously applied dielectric layers. Likewise, one or more layers of other substances may be applied over the layer of the element source. Such other dielectric layers may comprise luminescent phosphors and/or any other suitable compounds, especially inorganic compounds of Al, Pb, Si, Ti, rare earths (e.g., thorium), Group IA (e.g., cesium), and/or Group IIA (e.g., magnesium).

The source of the selected element is applied to the dielectric surface (or over a previously applied layer) by any convenient means including not by way of limitation vapor deposition; vacuum deposition; chemical vapor deposition, wet spraying upon the surface a mixture of solution of the layer substance suspended or dissolved in a liquid followed by evaporation of the liquid; dry spraying of the layer upon the surface; thermal evaporation using direct heat, electron beam, or laser; plasma flame and/or arc spraying and/or deposition; and sputtering target techniques.

Each layer of the source of the selected transition element is applied to the dielectric, as a surface or sub-layer, in an amount sufficient to obtain the desired beneficial result, usually to a thickness of at least about 100 angstrom units, with a typical thickness range of about 200 angstrom units per layer up to about 1 micron (10,000 angstrom units) per layer.

In the fabrication of a gaseous discharge panel, the dielectric material is typically applied to and cured on the surface of a supporting glass substrate or base to which the electrode or conductor elements have been previously applied. The glass substrate may be of any suitable composition such as a soda lime glass composition. Two glass substrates containing electrodes and cured dielectric are then appropriately sealed together, e.g., using thermal means, so as to form a panel.

In one preferred practice of this invention, each element containing layer is applied to the surface of the cured dielectric before the panel heat sealing cycle, with the substrate temperature during the layer application ranging from about 150° to about 600° F.

In accordance with the practice of this invention, it is contemplated using any suitable source of a transition element selected from vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), palladium (Pd), and platinum (Pt).

Typical sources include the elemental form of the selected element, a mineral, and/or a compound. It is especially contemplated using inorganic compounds.

Although insulating or semi-conductor materials are typically used, conductor materials may be used if the material is appropriately isolated within or on the dielectric so as not to be in direct contact with a source of electrical potential and/or ground.

Likewise if a conductive material is used in a multiple cell device, the geometric arrangement of the material may be such that no two cells are electrically connected by the conductive material. For example, a conductive material could be deposited as a spot over each discharge site.

The selected source is typically a solid. However, liquid materials may be used, especially if applied in a suitable binder.

Typical inorganic vanadium compounds include vanadium halides such as vanadium tribromide, vanadium tetrabromide, vanadium pentabromide, vanadium carbide, vanadium dichloride, vanadium trichloride, vanadium tetrachloride, vanadium trifluoride, vanadium diiodide, vanadium triiodide, and vanadium oxides such as vanadium dioxide, vanadium tetraoxide, vanadium pentoxide, and vanadium sesquioxide. Other compounds include vanadium diboride, vanadium oxychloride, vanadium oxybromide, vanadium oxydibromide, vanadium oxydichloride, vanadium oxydifluoride, vanadium disilicide, divanadium silicide, vanadium sulfate, vanadium monosulfide, vanadium disulfide, vanadium pentasulfide, vanadium trisulfide, and vanadium sesquisulfide.

Typical inorganic niobium compounds include niobium boride, niobium pentabromide, niobium carbide, niobium pentachloride, niobium pentafluoride, niobium hydride, niobium nitride, niobium oxybromide, niobium oxychloride, niobium potassium fluoride, and niobium oxides such as niobium dioxide, niobium monixide, niobium pentoxide, niobium trioxide, and niobium sesquioxide.

Typical inorganic tantalum compounds include tantalum diboride, tantalum bromide, tantalum carbide, tantalum chloride, tantalum iodide, tantalum fluoride, tantalum pentachloride, tantalum nitride, tantalum sulfide, and tantalum oxides including tantalum pentaoxide.

Typical inorganic chromium compounds include chromium monarsenide, chrominium monoboride, chromium dibromide, chromium tribromide, chromium carbonyl, chromium dicarbide, trichromium dicarbide, chromium dichloride, chromium trichloride, chromium difluoride, chromium trifluoride, chromium diiodide, chromium triiodide, chromium dinitrate, chromium trinitrate, chromium monomitride, chromium orthophosphate, chromium pyrophosphate, chromium monophosphide, chromium silicide, chromium sulfate (II and III), chromium monosulfide, chromium sesquisulfide, chromium sulfite, and chromium oxides such as chromium dioxide, chromium monoxide, chromium sesquioxide, and chromium trioxide.

Typical inorganic molybdenum compounds include molybdenum monocarbide, molybdenum dicarbide, molybdenum diboride, molybdenum monoboride, dimolybdenum boride, dimolybdenum carbide, molybdenum carbonyl, molybdenum dichloride, molybdenum trichloride, molybdenum tetrachloride, molybdenum pentachloride, molybdenum tetraiodide, molybdenum diiodide, molybdenum hexafluoride, molybdenum oxybromide, molybdenum oxytetrachloride, molybdenum oxytrichloride, molybdenum oxydichloride, trimolybdenum oxyhexachloride, molybdenum oxytetrafluoride, molybdenum disulfide, and molybdenum oxides such as molybdenum dioxide, molybdenum trioxide, molybdenum sesquioxide, and molybdenum pentoxide.

Typical inorganic tungsten compounds include tungsten diboride, tungsten dibromide, tungsten pentabromide, tungsten hexabromide, tungsten carbide, ditungsten carbide, tungsten hexachloride, tungsten pentachloride, tungsten dioxide, tungsten pentoxide, tungsten trioxide, tungsten oxytetrachloride, tungsten oxytetrabromide, tungsten dioxydibromide, tungsten dioxydichloride, tungsten oxytetrafluoride, tungsten silicide, tungsten trisulfide, tungsten disulfide, tungsten carbonyl, tungsten arsenide, tungsten dichloride, tungsten tetrachloride, tungsten diiodide, tungsten phosphide, ditunsten phosphide and tungsten diphosphide.

Typical inorganic manganese compounds include manganese diarsenide, manganese monoarsenide, manganese triarsenide, manganese dichloride, manganese difluoride, manganese dibromide, manganese diiodide, manganese carbide, manganese diboride, manganese monoboride, manganese pyrophosphate, manganese monophosphide, trimanganese diphosphide, manganese carbonate, manganese titanate, manganese tantalate, manganese selenate, manganese pentaselenate, manganese selenide, manganese selenite, manganese trichloride, manganese chloroplatinate, manganese chromite, manganese fluogallate, manganese fluosilicate, manganese trifluoride, manganese hydroxide, manganese hexaiodoplatinate, manganese nitrate, manganese monoxide (II and III), manganese dioxide, manganese heptoxide, manganese trioxide, manganese sesquioxide, manganese orthophosphate, manganese hypophosphite, manganese orthophosphite, manganese metasilicate, manganese monosilicide, manganese disilicide, dimanganese silicide, manganese sulfate (II and III), manganese sulfide, and manganese dithionate.

Typical inorganic technetium compounds include technetium bromide oxide, technetium chloride, technetium chloride oxide, technetium fluoride, technetium bromide, technetium oxide, technetium selenide, and technetium sulfide.

Typical inorganic rhenium compounds include rhenium bromide, rhenium pentacarbonyl, rhenium pentachloride, rhenium tetrachloride, rhenium trichloride, rhenium fluoride, rhenium hexafluoride, rhenium dioxide, rhenium heptoxide, rhenium peroxide, rhenium sesquioxide, rhenium trioxide, rhenium trioxybromide, rhenium trioxychloride, rhenium oxytetrachloride, rhenium oxytetrafluoride, rhenium dioxydifluoride, rhenium disulfide, rhenium heptasulfide, and rhenium tribromide.

Typical inorganic iron compounds include iron orthoarsenate, iron orthoarsenite, iron pyroarsenite, iron arsenide, iron diarsenide, iron boride, iron bromide, iron carbide, iron carbonate, iron ennea carbonyl, iron pentacarbonyl, iron tetracarbonyl, iron perchlorate, iron oxychloride, iron chloride, iron chloride hexammine, iron chloroplatinate, iron dichromate, iron chromite, iron ferricyanide, iron fluoride, iron fluosilicate, iron hydrogen cyanide, iron iodate, iron iodide, iron tetraiodide, iron nitrate, iron nitride, iron oxide, iron orthophosphate, iron pyrophosphate, iron monophosphide, diiron phosphide, triiron phosphide, iron hypophosphite, iron metasilicate, iron orthosilicate, iron silicide, iron sulfate, iron disulfide, iron sulfide, iron sulfite, iron tantalate, iron thiocyanate, iron thiosulfate, iron tungstate, and iron metavanadate.

Typical inorganic ruthenium compounds include ruthenium tetrachloride, ruthenium trichloride, ruthenium pentafluoride, ruthenium dioxide, ruthenium tetraoxide, ruthenium hydroxide, ruthenium oxychloride, ruthenium silicide, and ruthenium sulfide.

Typical inorganic osmium compounds include oxmium carbonyl chloride, osmium dichloride, osmium tetrachloride, osmium trichloride, osmium hexafluoride, osmium tetrafluoride, osmium tetraiodide, osmium tribromide, osmium triiodide, osmium tetrabromide, osmium carbonyl bromide, osmium hexachloride, osmium dioxide (both black and brown), osmium monoxide, osmium sesquioxide, osmium tetra oxide, osmium disulfide, osmium tetra sulfide, osmium sulfite, and osmium telluride.

Typical inorganic cobalt compounds include cobalt aluminate, cobalt orthoarsenate, cobalt arsenic sulfide, cobalt arsenide, cobalt monoboride, cobalt bromate, cobalt bromide, cobalt bromoplatinate, cobalt carbonate, cobalt tetracarbonyl, cobalt basic carbonate, cobalt tricarbonyl, cobalt chlorate, cobalt perchlorate, cobalt chloride, cobalt chloroplatinate, cobalt chlorostannate, cobalt chromate, cobalt cyanide, cobalt ferricyanide, cobalt ferrocyanide, cobalt fluogallate, cobalt fluoride, cobalt fluosilicate, cobalt iodate, cobalt iodide, cobalt iodoplatinate, cobalt nitrate, cobalt oxide, cobalt orthophosphate, cobalt phosphide, cobalt perrhenate, cobalt selenate, cobalt monoselenide, cobalt orthosilicate, cobalt silicide, cobalt disilicide, dicobalt silicide, cobalt orthostannate, cobalt sulfate, cobalt disulfide, cobalt monosulfide, cobalt sesquisulfide, tricobalt sulfide, cobalt sulfite, cobalt thiocyanate, cobalt orthotitanate, cobalt tungstate, and cobalt cobalt complexes such as hexammine cobalt bromide, diammine cobalt chloride (alpha and beta), hexammine cobalt chloride, hexammine cobalt iodide, hexammine cobalt nitrate, hexammine cobalt perrhenate, hexammine cobalt sulfate, ammonium tetranitrodiammine cobaltate, aquapentamminecobalt sulfate, cis-chloroaquotetramminecobalt chloride, chloropentammine cobalt chloride, triethylenediaminecobalt chloride, trinitrotriamminecobalt, trinitrotetramminecobalt nitrate, and potassium tetranitrodiamminecobaltate.

Typical inorganic rhodium compounds include: rhodium hexamminechloride, rhodium basic carbonylchloride, rhoeium trichloride, rhodium trifluoride, rhodium triiodide, rhodium nitrate, rhodium dioxide, rhodium sesquioxide, rhodium sulfate, rhodium monosulfide, rhodium sesquisesquioxide, and rhodium sulfite.

Typical inorganic iridium compounds include iridium tetrabromide, iridium tribromide, iridium carbonyl, iridium carbonyl chloride, iridium dichloride, iridium tetrachloride, iridium trichloride, iridium hexafluoride, iridium tetraiodide, iridium triiodide, iridium dioxide, iridium sesquioxide, iridium phosphor chloride, iridium selenide, iridium sulfate, iridium disulfide, iridium monosulfide, iridium sesquisulfide, and iridium telluride.

Typical inorganic palladium compounds include palladium bromide, palladium chloride, palladium iodide, palladium cyanide, palladium difluoride, palladium dichloride, palladium dibromide, palladium diiodide, palladium trichloride, palladium tribromide, palladium triiodide, palladium nitrate, palladium dioxide, palladium monoxide, palladium selenate, palladium selenide, palladium diselenide, palledium silicide, palladium sulfate, palladium disulfide, palladium monosulfide, palladium subsulfide, and palladium ditelluride.

Typical inorganic platinum compounds include platinum arsenide, platinum dibromide, platinum tetrabromide, platinum carbonyl bromide, platinum carbonyl dichloride, platinum dicarbonyl dichloride, diplatinum dicarbonyl tetrachloride, diplatinum tricarbonyl tetrachloride, platinum carbonyl diiodide, platinum carbonyl sulfide, platinum dichloride, platinum tetrachloride, platinum trichloride, platinum dicyanide, platinum dichlorocarbonyl dichloride, platinum difluoride, platinum hexafluoride, platinum tetrafluoride, platinum hydioxide, platinum diiodide, platinum tetraiodide, platinum triiodide, platinum monoxide, platinum dioxide, platinum sesquioxide, platinum trioxide, platinum pyrophosphate, platinum phosphide, platinum diselenide, platinum triselenide, platinum triselenide, platinum sulfate, platinum disulfide, platinum monosulfide, platinum sesquisulfide, platinum telluride, and platinum complexes such as tetramine platinum chloride, tetramminplatinum and chloroplatinite.

The use of this invention has many potential benefits. For example, sources of the selected element may be used alone or in combination with other elements (such as enumerated hereinbefore) to achieve lower panel operating voltages, thermal stability, more uniform panel operating voltages, decreased aging cycle time, etc.

Reference is made to the accompanying drawings and the figure thereon.

Figure 4:
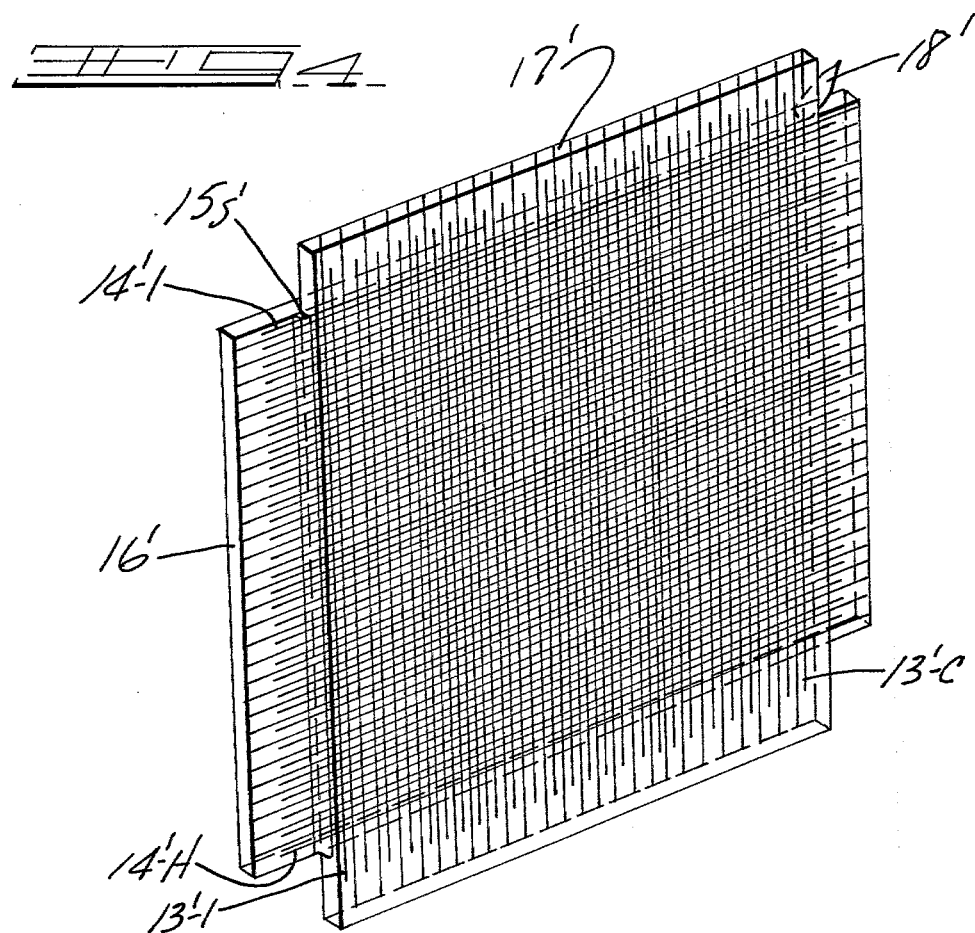

FIG. 1 is a partially cut-away plan view of a gaseous discharge display/memory panel as connected to a diagrammatically illustrated source of operating potentials, FIG. 2 is a cross-sectional view (enlarged, but not to proportional scale since the thickness of the gas volume, dielectric members and conductor arrays have been enlarged for purposes of illustration) taken on lines 2—2 of FIG. 1, FIG. 3 is an explanatory partial cross-sectional view similar to FIG. 2 (enlarged, but not to proportional scale), FIG. 4 is an isometric view of a gaseous discharge display/memory panel.

FIG. 5 is a partial cross-sectional view of an alternative embodiment of the invention.

The invention utilizes a pair of dielectric films 10 and 11 separated by a thin layer or volume of a gaseous discharge medium 12, the medium 12 producing a copious supply of charges (ions and electrons) which are alternately collectable on the surfaces of the dielectric members at opposed or facing elemental or discrete areas X and Y defined by the conductor matrix on non-gas-contacting sides of the dielectric members, each dielectric member presenting large open surface areas and a plurality of pairs of elemental X and Y areas. While the electrically operative structural members such as the dielectric members 10 and 11 and conductor matrixes 13 and 14 are all relatively thin (being exaggerated in thickness in the drawings) they are formed on and supported by rigid nonconductive support members 16 and 17 respectively.

Preferably, one or both of nonconductive support members 16 and 17 pass light produced by discharge in the elemental gas volumes. Preferably, they are transparent glass members and these members essentially define the overall thickness and strength of the panel. For example, the thickness of gas layer 12 as determined by spacer 15 is usually under 10 mils and preferably about 4 to 6 mils, dielectric layers 10 and 11 (over the conductors at the elemental or discrete X and Y areas) are usually between 1 and 2 mils thick, and conductors 13 and 14 about 8,000 angstroms thick. However, support members 16 and 17 are much thicker (particularly in larger panels) so as to provide as much ruggedness as may be desired to compensate for stresses in the panel. Support members 16 and 17 also serve as heat sinks for heat generated by discharges and thus minimize the effect of temperature on operation of the device. If it is desired that only the memory function be utilized, then none of the members need be transparent to light.

Except for being nonconductive or good insulators the electrical properties of support members 16 and 17 are not critical. The main function of support members 16 and 17 is to provide mechanical support and strength for the entire panel, particularly with respect to pressure differential acting on the panel and thermal shock. As noted earlier, they should have thermal expansion characteristics substantially matching the thermal expansion characteristics of dielectric layers 10 and 11. Ordinary ¼" commercial grade soda lime plate glasses have been used for this purpose. Other glasses such as low expansion glasses or transparent devitrified glasses can be used provided they can withstand processing and have expansion characteristics substantially matching expansion characteristics of the dielectric coatings 10 and 11. For given pressure differentials and thickness of plates, the stress and deflection of plates may be determined by following standard stress and strain formulas (see R. J. Roark, *Formulas for Stress and Strain*, McGraw-Hill, 1954).

Spacer 15 may be made of the same glass material as dielectric films 10 and 11 and may be an integral rib formed on one of the dielectric members and fused to the other members to form a bakeable hermetic seal enclosing and confining the ionizable gas volume 12. However, a separate final hermetic seal may be effected by a high strength devitrified glass sealant 15S. Tubulation 18 is provided for exhausting the space between dielectric members 10 and 11 and filling that space with the volume of ionizable gas. For large panels small beadlike solder glass spacers such as shown at 15B may be located between conductor intersections and fused to dielectric members 10 and 11 to aid in withstanding stress on the panel and maintain uniformity of thickness of gas volume 12.

Conductor arrays 13 and 14 may be formed on support members 16 and 17 by a number of well-known processes, such as photoetching, vacuum deposition, stencil screening, etc. In the panel shown in FIG. 4, the center-to-center spacing of conductors in the respective arrays is about 17 mils. Transparent or semi-transparent conductive material such as tin oxide, gold or aluminum can be used to form the conductor arrays and should have a resistance less than 3000 ohms per line. Narrow opaque electrodes may alternately be used so that discharge light passes around the edges of the electrodes to the viewer. It is important to select a conductor material that is not attacked during processing by the dielectric material.

It will be appreciated that conductor arrays 13 and 14 may be wires or filaments of copper, gold, silver or aluminum or any other conductive metal or material. For example 1 mil wire filaments are commercially available and may be used in the invention. However, formed in situ conductor arrays are preferred since they may be more easily and uniformly placed on and adhered to the support plates 16 and 17.

Dielectric layer members 10 and 11 are formed of an inorganic material and are preferably formed in situ as an adherent film or coating which is not chemically or physically effected during bake-out of the panel. One such material is a solder glass such as Kimble SG-68 manufactured by and commercially available from the assignee of the present invention.

This glass has thermal expansion characteristics substantially matching the thermal expansion characteristics of certain soda-lime glasses, and can be used as the dielectric layer when the support members 16 and 17 are soda-lime glass plates. Dielectric layers 10 and 11 must be smooth and have a dielectric strength of about 1000 v. and be electrically homogeneous on a microscopic scale (e.g., no cracks, bubbles, crystals, dirt, surface films, etc.). In addition, the surfaces of dielectric layers 10 and 11 should be good photoemitters of electrons in a baked out condition. Alternatively, dielectric layers 10 and 11 may be overcoated with materials designed to produce good electron emission, as in U.S. Pat. No. 3,634,719, issued to Roger E. Ernsthausen. Of course, for an optical display at least one of dielectric layers 10 and 11 should pass light generated on discharge and be transparent or translucent and, preferably, both layers are optically transparent.

The preferred spacing between surfaces of the dielectric films is about 4 to 6 mils with conductor arrays 13 and 14 having center-to-center spacing of about 17 mils.

The ends of conductors 14-1 . . . 14-4 and support member 17 extend beyond the enclosed gas volume 12 and are exposed for the purpose of making electrical connection to interface and addressing circuitry 19. Likewise, the ends of conductors 13-1 . . . 13-4 on support member 16 extend beyond the enclosed gas volume 12 and are exposed for the purpose of making electrical connection to interface and addressing circuitry 19.

As in known display systems, the interface and addressing circuitry or system 19 may be relatively inexpensive line scan systems or the somewhat more expensive high speed random access systems. In either case, it is to be noted that a lower amplitude of operating potentials helps to reduce problems associated with the interface circuitry between the addressing system and the display/memory panel, per se. Thus, by providing a panel having greater uniformity in the discharge characteristics throughout the panel, tolerances and operating characteristics of the panel with which the interfacing circuitry cooperate, are made less rigid.

In FIG. 5 there is shown an explanatory partial cross-sectional view similar to FIG. 3 (enlarged, but not to proportional scale) illustrating one particular embodiment of the present invention, specifically a continuous thin film or layer 70 of inorganic transition metal oxide applied to the inner (gas contacting) surface of each dielectric body 10, 11. In other embodiments disclosed hereinbefore, the film or layer 70 is discontinuous, i.e., applied only at or near discharge sites.

We claim:

1. In a gas discharge device containing at least two electrodes defining a gas discharge site, at least one of the electrodes being insulated from the gas by a dielectric member, the improvement wherein the gas-contacting surface of at least one dielectric member contains a non-conductive inorganic oxide of at least one transition metal selected from the group consisting of Nb, Ta, Cr, Mn, Tc, Re, Fe, Ru, Os, Co, Rh, Ir, Pd, and Pt.

2. The invention of claim 1 wherein the transition metal oxide is a continuous dielectric layer on the gas-contacting surface of the dielectric member.

3. The invention of claim 2 wherein the layer has a thickness of at least 100 angstrom units.

4. The invention of claim 1 wherein the transition metal oxide is a discontinuous layer on the gas-contacting surface of the dielectric member, said transition metal oxide being positioned at each gas discharge site physically isolated from transition metal oxide positioned at any other gas discharge site.

5. The invention of claim 4 wherein the layer has a thickness of at least 100 angstrom units.

6. In a multiple gaseous discharge display/memory panel having an electrical memory and capable of producing a visual display, the panel being characterized by an ionizable gaseous medium in a gas chamber formed by a pair of opposed dielectric material charge storage members, each of which dielectric members is respectively backed by an array of electrodes, the electrodes behind each dielectric member being oriented with respect to the electrodes behind the opposing dielectric member so as to define a plurality of discrete discharge units, the improvement wherein the gas-contacting surface of at least one dielectric member contains a non-conductive inorganic oxide of at least one transition metal selected from the group consisting of Nb, Ta, Cr, Mn, Tc, Re, Fe, Ru, Os, Co, Rh, Ir, Pd, and Pt.

7. The invention of claim 6 wherein the gaseous medium is a mixture comprising at least one rare gas selected from a member of the group consisting of neon, argon, xenon, and krypton.

8. The invention of claim 7 wherein the gaseous medium mixture also contains at least one member selected from the group consisting of mercury and helium.

9. The invention of claim 3 wherein the layer has a thickness range of about 200 angstrom units to about 1 micron.

10. The invention of claim 5 wherein the layer has a thickness range of about 200 angstrom units to about 1 micron.

11. The invention of claim 6 wherein the transition metal oxide is a continuous dielectric layer on the gas-contacting surface of the dielectric member.

12. The invention of claim 11 wherein the layer has a thickness of at least 100 angstrom units.

13. The invention of claim 12 wherein the layer has a thickness range of about 200 angstrom units to about 1 micron.

14. The invention of claim 6 wherein the transition metal oxide is a discontinuous layer on the gas-contacting surface of the dielectric member, said transition metal oxide being positioned at each gas discharge site physically isolated from transition metal oxide positioned at any other gas discharge site.

15. The invention of claim 14 wherein the layer has a thickness of at least 100 angstrom units.

16. The invention of claim 15 wherein the layer has a thickness range of about 200 angstrom units to about 1 micron.

17. In a gas discharge device comprising at least two electrodes defining a gas discharge site, at least one of the electrodes being insulated from the gas by a dielectric member, the improvement wherein the gas-contacting surface of at least one dielectric member consists of a non-conductive inorganic oxide of at least one transition metal selected from the group consisting of V, Nb, Ta, Cr, Mo, W, Mn, Tc, Re, Fe, Ru, Os, Co, Rh, Ir, Pd and Pt in an amount sufficient to provide lower operating voltages which are more uniform, thermal stability and decreased aging cycle time.

18. The invention of claim 17 wherein the transition metal oxide is a continuous dielectric layer on the gas-contacting surface of the dielectric member.

19. The invention of claim 18 wherein the layer has a thickness of at least 100 angstrom units.

20. The invention of claim 19 wherein the layer has a thickness range of about 200 angstrom units to about 1 micron.

21. The invention of claim 17 wherein the transition metal oxide is a discontinuous layer on the gas-contacting surface of the dielectric member, said transition metal oxide being positioned at each gas discharge site physically isolated from transition metal oxide positioned at any other gas discharge site.

22. The invention of claim 21 wherein the layer has a thickness of at least 100 angstrom units.

23. The invention of claim 22 wherein the layer has a thickness range of about 200 angstrom units to about 1 micron.

24. An article of manufacture comprising a dielectric body having a structural configuration for use in a gas discharge display/memory device, said dielectric body having at least one electrode on one side thereof and on the opposite side thereof having a layer of a non-conductive inorganic oxide of at least one transition metal selected from the group consisting of V, Nb, Ta, Cr, Mo, W, Mn, Tc, Re, Fe, Ru, Os, Co, Rh, Ir, Pd and Pt in direct contact with the surface of the body in an amount sufficient to provide lower operating voltages which are more uniform, thermal stability and decreased aging cycle time.

25. The invention of claim 24 wherein the layer has a thickness of at least 100 angstrom units.

26. The invention of claim 25 wherein the layer has a thickness range of about 200 angstrom units to about 1 micron.

27. In the method of operating a gas discharge display/memory device comprising an ionizable gaseous medium in a gas chamber formed by a pair of dielectric material members having opposed gaseous medium contacting surfaces, which dielectric material members are respectively backed by a series of parallel-like electrode members, the electrode members behind each dielectric material member being transversely oriented with respect to the electrode members behind the opposing dielectric material members so as to define a plurality of discrete discharge volumes, each constituting a discharge unit, and wherein the gas is selectively ionized within each discharge unit by operating voltages applied to the transversely oriented electrode members, the improvement which comprises decreasing the operating voltages of the device by coating the gaseous medium contacting surface of each opposed dielectric material member with a layer of a non-conductive inorganic oxide of at least one transition metal selected from the group consisting of V, Nb, Ta, Cr, Mo, W, Mn, Tc, Re, Fe, Ru, Os, Co, Rh, Ir, Pd and Pt.

28. The invention of claim 27 wherein the layer has a thickness of at least 100 angstrom units.

29. The invention of claim 28 wherein the layer has a thickness range of about 200 angstrom units to about 1 micron.

* * * * *